(12) United States Patent
Asano

(10) Patent No.: US 7,408,423 B2
(45) Date of Patent: Aug. 5, 2008

(54) SEMICONDUCTOR DEVICE AND ADJUSTING METHOD FOR SEMICONDUCTOR DEVICE

(75) Inventor: Shigetaka Asano, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 97 days.

(21) Appl. No.: 11/136,556

(22) Filed: May 25, 2005

(65) Prior Publication Data

US 2006/0139131 A1    Jun. 29, 2006

(30) Foreign Application Priority Data

Dec. 24, 2004    (JP) ............................. 2004-374482

(51) Int. Cl.
*H03H 11/04* (2006.01)
(52) U.S. Cl. ............................ 333/12; 333/33; 361/772; 361/794
(58) Field of Classification Search .................... 333/33, 333/12; 361/772, 794
See application file for complete search history.

(56) References Cited

U.S. PATENT DOCUMENTS 5,521,431 A * 5/1996 Tahara ......................... 257/676
5,886,595 A * 3/1999 Von Stein .................... 333/218

FOREIGN PATENT DOCUMENTS

| JP | 8-162803 | 6/1996 |
| JP | 9-260522 | 10/1997 |
| JP | 2002-76967 | 3/2002 |

* cited by examiner

*Primary Examiner*—Stephen E Jones
(74) *Attorney, Agent, or Firm*—Westerman, Hattori, Daniels & Adrian, LLP.

(57) ABSTRACT

An object of the invention is to provide a semiconductor device and an adjusting method for a semiconductor device wherein power source noises and noises radiated as radio waves can be reduced and power source noises inside the semiconductor device can be cut. The open stub OS1 is formed in the upper wiring layer of the semiconductor device 1. The stub length L1 is set to a length of ¼ of the wavelength of the known frequency containing peak components of noises. The noise receiving part AT1 is disposed adjacent to the open stub OS1. The open stub OS1 is connected to the power source wiring 4 by an interlayer wiring 6. The noise receiving part AT1 is biased to a ground potential. The basic wave component and odd-number harmonic waves of noises that are generated from the PLL circuit 11 and propagate (the arrow Y1 of FIG. 2) in the power source wiring 4 are reflected (arrow Y2 of FIG. 2) by the open stub OS1 so as to return to the PLL circuit 11, and do not reach the filter circuit 12.

4 Claims, 8 Drawing Sheets

VIEW OF EQUIVALENT CIRCUIT 10 OF SEMICONDUCTOR DEVICE 1

FIG. 1    SCHEMATIC VIEW OF WIRINGS INSIDE SEMICONDUCTOR DEVICE 1

VIEW OF EQUIVALENT CIRCUIT 10 OF SEMICONDUCTOR DEVICE 1

DIAGRAM SHOWING TRANSMISSION CHARACTERISTIC OF OPEN STUB OS1

FIG. 4  SCHEMATIC VIEW OF THE INSIDE OF SEMICONDUCTOR DEVICE 1a

SCHEMATIC VIEW OF BGA PACKAGE OF SEMICONDUCTOR DEVICE 1c

FLOWCHART SHOWING PROCEDURES OF OPEN STUB LENGTH ADJUSTMENT

DIAGRAM SHOWING EQUIVALENT CIRCUIT 10a OF SEMICONDUCTOR DEVICE 1

CIRCUIT DIAGRAM PROVIDED WITH THE OPEN STUB IN THE RELATED ART

SEMICONDUCTOR DEVICE AND ADJUSTING METHOD FOR SEMICONDUCTOR DEVICE

CROSS-REFERENCE TO RELATED APPLICATIONS

This application is based upon and claims the benefit of priority from each of the prior Japanese Patent Application No. 2004-374482 filed on Dec. 24, 2004, the entire contents of which are incorporated herein by reference.

BACKGROUND OF THE INVENTION

1. Field of the Invention

The present invention relates to power source noise control of a semiconductor device, and more specifically, noise control using an open stub.

2. Description of Related Art

In recent semiconductor integrated circuits, higher integration and higher synchronization speeds are realized, and clock skew is reduced for realizing high-speed stable operations. Therefore, timings of through currents are synchronized, and power source noise tends to increase. Furthermore, according to the increase in speed of a multi-pin integrated circuit, switching of an output buffer or the like causes synchronous switching noise which fluctuates the power source.

A circuit disclosed in Japanese Unexamined Patent Publication No. H09(1997)-260522 is shown in FIG. 9. FIG. 9 is an example of an Equivalent circuit when it is fixed to a package consisting of an insulator with a semiconductor element mounted and a board. In this figure, an integrated circuit is indicated by a, a PGA package is indicated by b, and a board is indicated by c. For example, in the PGA package b and the board c, inductances L101 and L102 and resistances are parasitically generated, and within the integrated circuit a, an input buffer 102 and an output buffer 103 are formed, and the former buffer is electrically connected to a pad 104 formed within the integrated circuit a. Furthermore, on the board c, a VDD terminal 105, a VSS terminal 106, and a 5V power source 107 are provided, and a band filter 108 provided in the PGA package is electrically connected to the VDD terminal 105. Therefore, in the conventional invention, a frequency as a main component of noise is cut by the band filter 108 to reduce noise at the D point. As described above, by providing a 40 mm band filter 108 between the input and output power sources, only the frequency of the main component of noise is cut off and noise propagation is prevented.

As techniques relating to the description given above, Japanese Unexamined Patent Publications No. 2002-76967 and No. H08 (1996)-162803 are disclosed.

SUMMARY OF THE INVENTION

However, with the prior art described in the publication '522, a method for preventing noise propagation by reflecting a center frequency component of noise by a band filter 8 (open stub) is described, however, no description about a method for reducing noise components themselves is given. Therefore, reflected noise components exist as standing waves and may cause stable operations of the semiconductor device to be lost.

In Publication No. H09-260522, no description about a method for reducing noise radiated as radio waves from a band filter 108 is given. Therefore, noise radiated as radio waves may influence the periphery including circuits, etc., inside the chip, and such a situation cannot be prevented.

Publication No. H09-260522, noise inputted or outputted from the integrated circuit 100 can be cut by the band filter 108 (open stub), however, noise between block circuits inside the integrated circuit 100 cannot be cut. Therefore, although erroneous operations caused by noise between the integrated circuit 100 and other apparatuses can be prevented, erroneous operations of the integrated circuit 100 itself caused by noise occurring inside the integrated circuit 100 cannot be prevented.

Publication No. H09-260522, no description about a method for adjusting the stub length of the band filter 108 (open stub) is given. Therefore, for each semiconductor device, the center frequency to be cut by the open stub cannot be adjusted according to a frequency including existence of a maximum value of noise that occurs in actuality. Therefore, the semiconductor device is easily influenced by scattering of the center frequency of noise, so that the influence of power source noise cannot be effectively prevented.

The present invention has been made to solve at least one of the problems mentioned in the Background Art given above, and an object is to provide a semiconductor device and an adjusting method for the semiconductor device which can reduce power source noise and noise itself radiated as radio waves, cut power source noise inside the semiconductor device, and adjust the center frequency of the power source noise to be cut in the semiconductor device by using an open stub.

To achieve the purpose of the invention, according to one aspect of the present invention, there is provided a semiconductor device comprising: at least one of open stubs which is connected to a power source wiring to which noise containing a predetermined frequency component is transmitted, and has a length corresponding to a ¼ wavelength of the predetermined frequency, and a first conducting part which is biased to a predetermined potential and provided adjacent to the open stub.

An open stub is connected to the power source wiring. To the power source wiring, noise containing a predetermined frequency component is transmitted. The length of the open stub is set to ¼ of the wavelength of the predetermined frequency contained in the noise. A first conducting part is biased to a predetermined potential and positioned adjacent to the open stub.

The open stub having a length corresponding to a ¼ wavelength shows BEF (band eliminate filter) performance with respect to a predetermined frequency component contained in noise, and reflects noise of this predetermined frequency component. Therefore, noise with the predetermined frequency component is prevented from passing through the open stub. Furthermore, noise is radiated from the open stub as a radio wave, and the radiated noise is received by the first conducting part and propagates to a predetermined bias.

Thereby, noise propagation in the power source wiring inside the semiconductor device can be prevented. Namely, not only noise propagation between semiconductor devices but also erroneous operations due to noise propagation between block circuits inside the semiconductor device can be prevented. Therefore, noise cutting can be carried out pinpoint in smaller units, that is, at a level of noise cutting between blocks, so that noise propagation can be more effectively prevented, and erroneous operations of the semiconductor device can be prevented. The open stub shows BEF performance not only for a predetermined frequency (basic wave component) but also for odd-number harmonic components, so that it is effective for prevention of noise propagation of CLK that is close to a square wave containing odd-number harmonic components.

Furthermore, in the first conducting part, noise radiated as radio waves is received and the received noise is sent to the potential which is biased in a predetermined level, whereby the noise components themselves existing in the power source wiring can be reduced.

According to another aspect of the invention, there is provided an adjusting method for a semiconductor device having at least one of open stubs to be connected to a power source wiring to which noise containing a predetermined frequency component is transmitted, comprising the steps of: measuring a noise maximum value of the noise; comparing the noise maximum value obtained in the step of measuring the noise maximum value and a predetermined noise permissible value; and adjusting the length of at least one of the open stubs to be connected to the power source wiring according to the results of the comparing step, wherein the step of measuring the noise maximum value, the step of comparing, and the step of adjusting the length of the open stubs are repeated.

In the step of measuring a noise maximum value, a maximum noise value in the entire frequency band is measured. The measured noise maximum value is compared with a predetermined noise permissible standard value set in advance according to the design standards and required specifications of the semiconductor device. As a result of the comparing step, when the noise maximum value is smaller than the noise permissible standard value, the noise value is permitted, so that the step does not shift to the step of adjusting the length of the open stub. On the other hand, when the noise maximum value is larger than the noise permissible standard value, the step shifts to the step of adjusting the length of the open stub, and the length of the open stub is adjusted. When the open stub length is shortened, the frequency components of the power source noise which can be reflected become high, and on the contrary, when the open stub length is lengthened, frequency components of power source noise which can be reflected become low. When the step of adjusting the length of the open stub is carried out, the step returns to the step of measuring a noise maximum value. Then, the step of measuring a noise maximum value and the step of adjusting the length of the open stub are repeated until the noise maximum value is made smaller than the noise permissible standard value or the number of times of repetition reaches a predetermined number.

Thereby, frequency components of noise which are desired to be cut can be adjusted after completion of a semiconductor device. For each semiconductor device, it becomes possible to adjust the center frequency of the BEF performance of the open stub according to a measured noise maximum value. Therefore, even when the predetermined frequency component contained in noise scatters, the noise can be cut in response to the scattering, so that influence of power source noise can be effectively prevented regardless of scattering. Therefore, it becomes possible to increase the yield of the semiconductor device and noise resistance of the semiconductor device.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 4 is a schematic view of the inside of a semiconductor device 1a;

DETAILED DESCRIPTION OF THE PREFERRED EMBODIMENTS

Hereinafter, embodiments of the semiconductor storage device of the invention are described in detail with reference to FIG. 1 through FIG. 8. A first embodiment of the invention is described with reference to FIG. 1 through FIG. 3. The first embodiment is an embodiment in a case where an open stub is disposed in a power supply wiring inside a chip of a semiconductor device.

Figure 1:
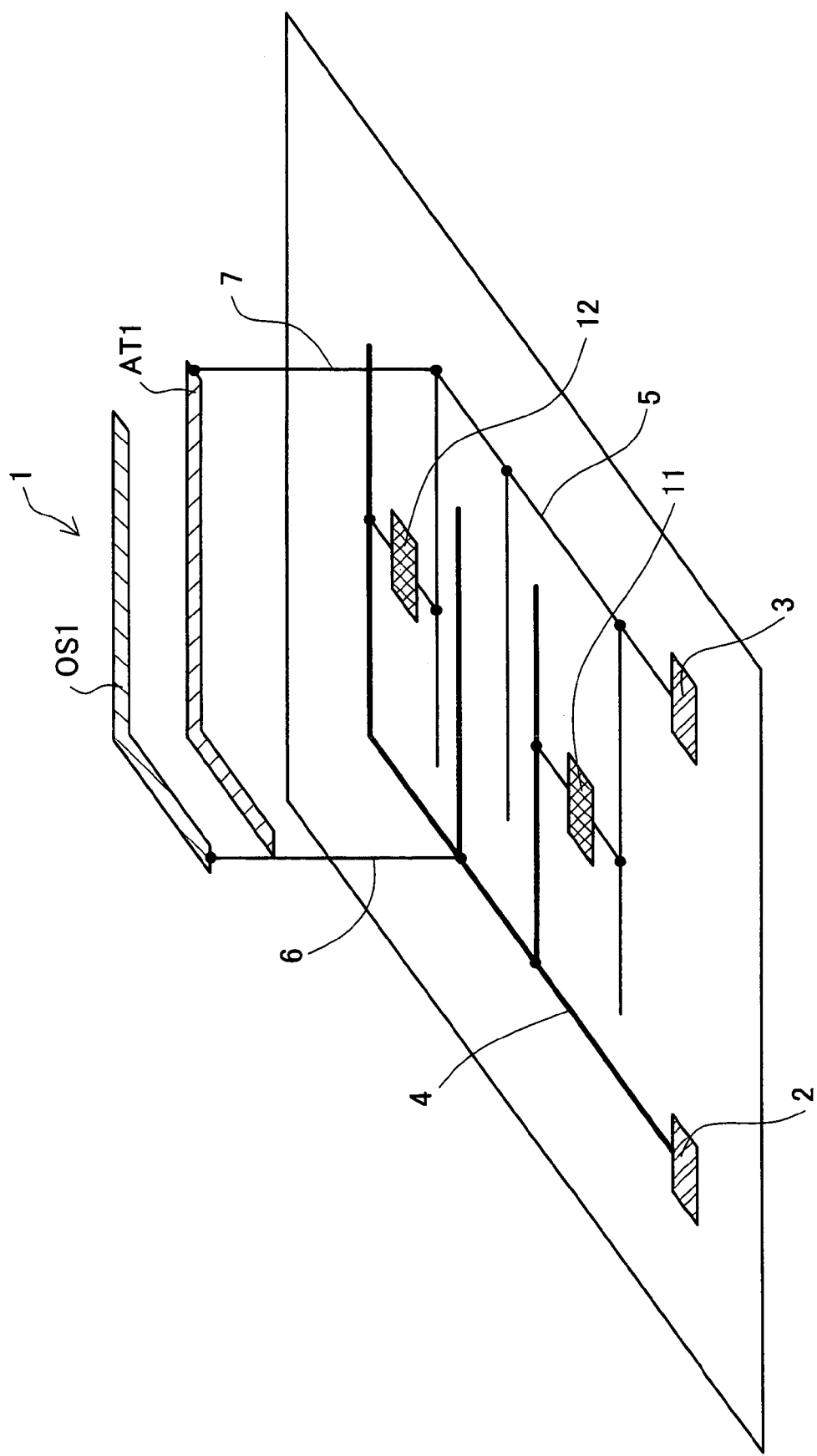
FIG. 1 is a schematic view of wirings inside a semiconductor device 1.

A schematic view of multi-layered metal wiring inside a semiconductor device 1 relating to the invention is shown in FIG. 1. In the semiconductor device 1, a power source pad 2 and a ground pad 3 are provided. To the power source pad 2, a power source wiring 4 is connected, and to the ground pad 3, a ground wiring 5 is connected. The power source wiring 4 and the ground wiring 5 are disposed in a First wiring layer so as to form a power source wiring network. Between the power source wiring 4 and the ground wiring 5, many circuit blocks are connected. This embodiment shows a case where a PLL circuit 11 and a filter circuit 12 are connected as examples of the circuit blocks.

An open stub OS1 is formed in an upper wiring layer in the semiconductor device 1 by using a method for forming metal wiring. A noise receiving part AT1 is disposed so as to be adjacent to the open stub OS1 by being formed in a wiring layer just below the wiring layer including the open stub OS1 by the method for forming metal wiring. The position of forming the noise receiving part AT1 is adjacent to the open stub OS1, and may be in the same wiring layer as that of the open stub OS1 or in the upper wiring layer. The open stub OS1 is connected to the power source wiring 4 by an interlayer wiring 6. The noise receiving part AT1 is connected to the ground wiring 5 by an interlayer wiring 7, and biased to a ground potential.

Figure 2:
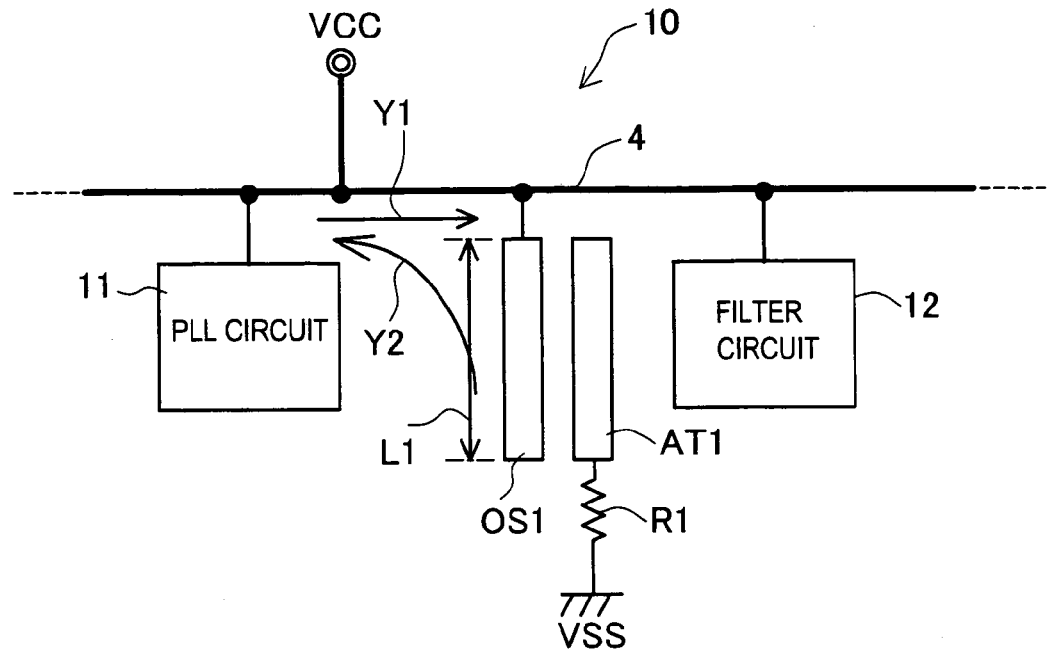
FIG. 2 is a view of an equivalent circuit 10 of the semiconductor device 1.

FIG. 2 shows an equivalent circuit 10 of the semiconductor device 1 of FIG. 1. The equivalent circuit 10 includes a PLL circuit 11, a filter circuit 12, an open stub OS1, and a noise receiving part AT1. The power source VCC is supplied to the PLL circuit 11 and the filter circuit 12 via the power source wiring 4. To the line of the power source wiring 4 connecting the PLL circuit 11 and the filter circuit 12, the open stub OS1 is connected. The noise receiving part AT1 is provided adjacent to the open stub OS1. The noise receiving part AT1 is biased to a ground potential by being connected to a ground voltage VSS via a resistor R1. Herein, the resistor R1 may consist of a resistor or a resistance component such as via resistance of the interlayer wiring 7 of FIG. 1.

A plurality of noises having a predetermined frequency component are generated from the PLL circuit 11 and propagate via the power source wiring 4. Herein, the center frequency having a peak component in the noises generated from the PLL circuit 11 is known from an operation frequency and timing design of the PLL circuit 11. Therefore, the stub length L1 of the open stub OS1 is set to ¼ of the wavelength of the known frequency with the peak component of the noises.

Action is described here. Since the front end of the open stub OS1 is opened, the voltage amplitude becomes maximum at the front end of the open stub OS1. The stub length L1 is set to ¼ of the wavelength of the center frequency of the noises, so that the phase differs by 90 degrees between the front end and the base end of the open stub OS1. Therefore, since the amplitude becomes maximum at the front end, the voltage amplitude is zero at the base end. Accordingly, the base end of the stub acts like a GND at the center frequency, so that the open stub OS1 acts as a BEF (band eliminate filter).

Figure 3:
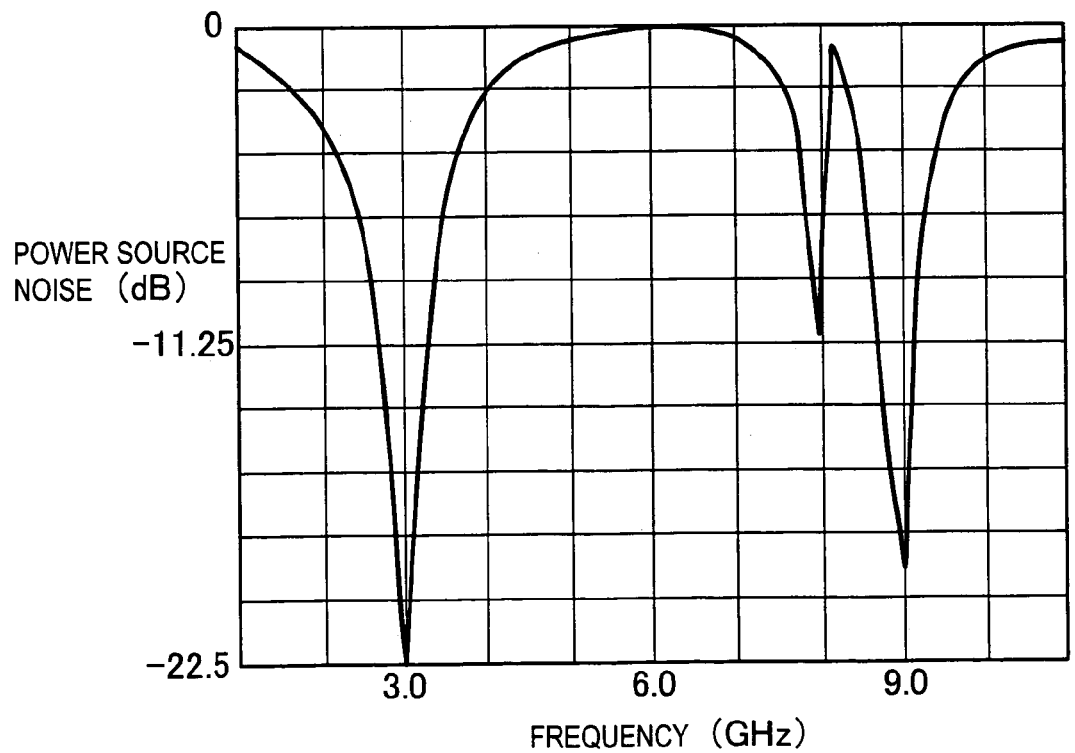
FIG. 3 is a diagram showing transmission characteristic of open stub OS1.

The transmission characteristic of the open stub OS1 is described by using the graph of FIG. 3. The graph of FIG. 3 shows the results of simulation when the stub length L1 of the open stub OS1 is matched with the center frequency=3 (GHz) of noises. From the graph, it is found that the high BEF performance appears conspicuously and the noise value was reduced by approximately 20 (dB) at the frequency of 3 (GHz) as a basic wave and the frequency of 9 (GHz) as a third harmonic wave. Herein, the reason for the noise value reduced not only at the basic wave but also at the third harmonic wave (9 GHz) is that the open stub OS1 of the ¼ wavelength at 3 (GHz) corresponds to a ¾ wavelength at 9 (GHz), and the voltage amplitude at the base end of the open stub OS1 is zero even at 9 (GHz). Therefore, the basic wave component and the odd-number harmonic wave of noises that are generated from the PLL circuit 11 and propagate (arrow Y1 of FIG. 2) in the power source wiring 4 are reflected (arrow Y2 of FIG. 2) so as to return to the PLL circuit 11 by the open stub OS1, so that they do not reach the filter circuit 12.

Furthermore, noises outputted from the PLL circuit 11 have a frequency component according to a clock frequency that operates the PLL circuit 11. The clock is close to a square wave, and the square wave contains many odd-number harmonic components, so that noises outputted from the PLL circuit 11 also contain many odd-number harmonic components. On the other hand, the open stub OS1 shows BEF performance for the odd-number harmonic waves as described above, so it can reflect not only the basic wave component but also odd-number harmonic components of noises. Namely, the open stub OS1 is suitable for cutting noises containing many harmonic waves, so that noises outputted from the PLL circuit 11 can be effectively cut off.

Thereby, it becomes possible that the basic wave component and odd-number harmonic components of power source noises generated from the PLL circuit 11 are reflected by the open stub OS1 and noises are prevented from propagating into the filter circuit 12, so that the power source of the filter circuit 12 can be stabilized. Then, the operations themselves of the filter circuit 12 become stable, and it becomes possible to prevent erroneous operations of the entire semiconductor device 1. The circuit as a source of noises is not limited to the PLL circuit 11. A circuit is possible to generate noises containing frequency components as long as it consumes currents periodically.

Noises are radiated as radio waves from the open stub OS1. Noises radiated as radio waves are received by the noise receiving part AT1, and consumed at an impedance of a resistor R1. Thereby, in addition to the reflection of the center frequency component of noises by the open stub OS1, the noise components themselves can be reduced by the noise receiving part AT1.

Furthermore, when no noise receiving part AT1 is provided, noises themselves cannot be reduced, so that standing waves caused by power source noises exist in the power source wiring 4, and this is not preferable in terms of stable operations of the semiconductor device. However, by providing the noise receiving part AT1, the power source noise components themselves can be reduced, so that the standing waves can be reduced, and operations of the semiconductor device can be made stable.

According to the semiconductor device 1 of the first embodiment, as described in detail above, propagation of power source noises in the power source wiring between blocks inside the semiconductor device can be prevented by the open stub. Therefore, not only erroneous operations due to noise propagation between semiconductor devices but also erroneous operations due to noise propagation between block circuits inside the semiconductor device can be prevented. Therefore, noise cutting can be carried out pinpoint in smaller units, that is, at a level of noise cutting between blocks, and this more effectively prevents noises from propagating and prevents the semiconductor device from erroneously operating.

Furthermore, by providing the noise receiving part including resistor components, not only are the frequency components of noises reflected but also the noise components themselves are reduced by impedance. Namely, in comparison with the case where no noise receiving part is provided, the power source noise components themselves can be reduced. Therefore, it becomes possible to reduce the standing waves caused by power source noises existing in the power source wiring, and this contributes to stable operations of the semiconductor device 1.

Figure 4:
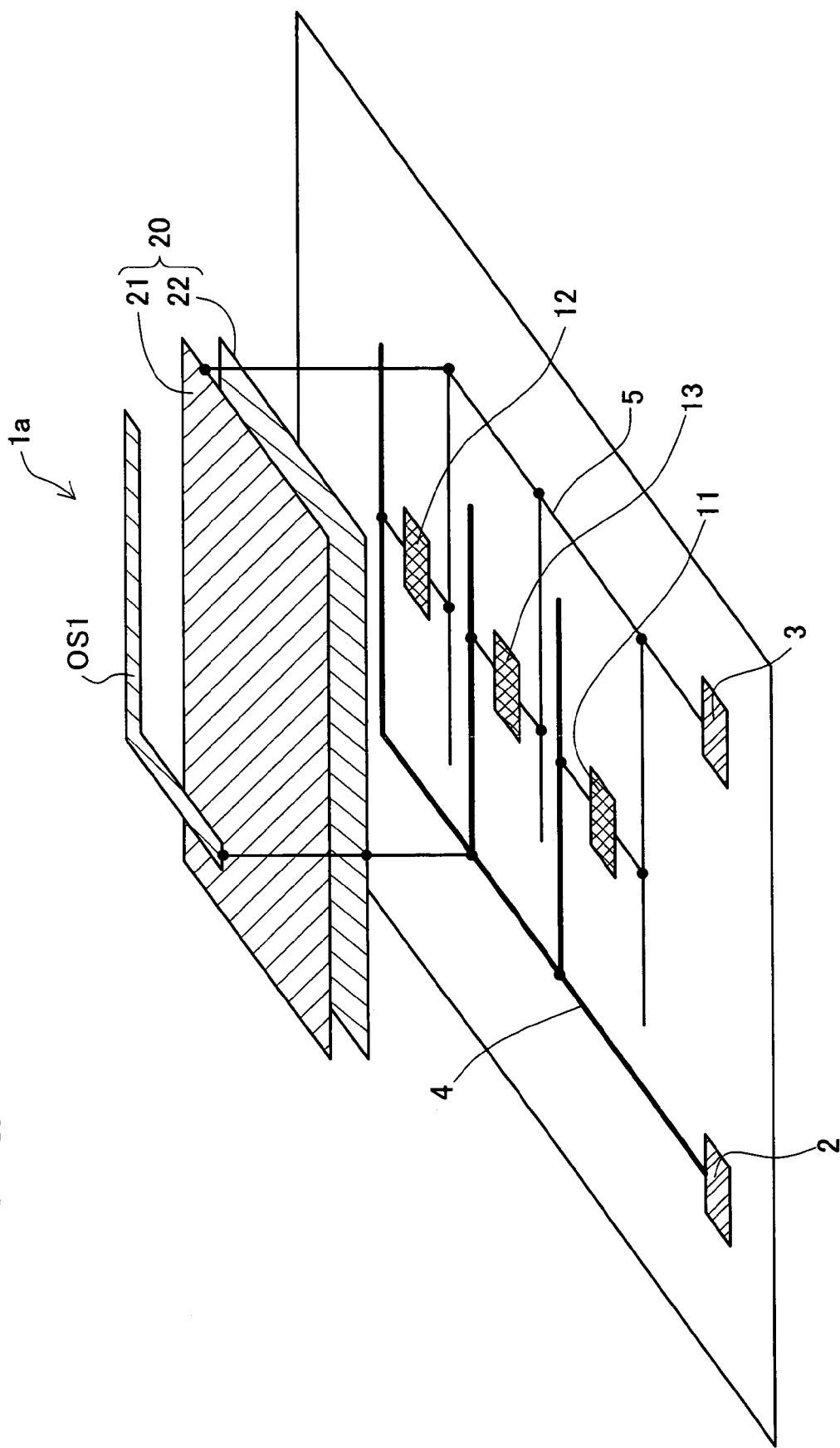

A second embodiment of the invention is described with reference to FIG. 4. The second embodiment is an embodiment in which a shield is provided inside the chip in the case where the open stub to be connected to the power source wiring is disposed inside the chip of the semiconductor device. A schematic view of the inside of a semiconductor device 1a relating to this embodiment is shown in FIG. 4. The semiconductor device 1a has a shield part 21 and a power source electrode part 22 in place of the noise receiving part AT1 described in the first embodiment. The shield part 21 has a wide area to cover the open stub OS1 so as to shield it from radio waves radiated from the open stub OS1. By forming the shield part 21 in the wiring layer just below the wiring layer including the open stub OS1 by the method for forming metal wiring, the shield part 21 is disposed adjacent to the open stub OS1. Furthermore, by forming the power source electrode part 22 in the wiring layer just below the wiring layer including the shield part 21 by the method for forming metal wiring, the power source electrode part 22 is disposed adjacent to the shield part 21 so as to be insulated from the shield part 21. The shield part 21 is connected to the ground wiring 5, and the power source electrode 22 is connected to the power source wiring 4. Other structural points are the same as those of the semiconductor device 1 (FIG. 1) of the first embodiment, so that description thereof is omitted herein. The position of forming the shield part 21 is not limited as long as it is adjacent to the open stub OS1, and it may be formed in a wiring layer above the open stub OS1.

Action is described herein. Noises are radiated as radio waves from the open stub OS1. The shield part 21 serves as a shield and shields the radio waves. Therefore, the radio waves do not reach the first wiring layer including the PLL circuit 11 and others and are prevented from harmfully influencing these circuits.

Furthermore, the shield part 21 having a wide area and the power source electrode part 22 are arranged proximal to each other while being insulated from each other to form an MIM capacitor part 20. The MIM capacitor part 20 is connected between the power source wiring 4 and the ground wiring 5, so that it serves as a decoupling capacitor to absorb fluctuations in power source potential and ground potential caused by noises. Therefore, erroneous operations of the semiconductor device 1 due to the noises can be prevented.

Herein, it is necessary that the shield part 21 is a conductor having a wide area. Structurally, the MIM capacitor needs an electrode with a wide area. Therefore, by commonly using the shield part 21 as an electrode of the MIM capacitor, the MIM capacitor part 20 can be constructed without newly increasing its occupying area inside the chip, the MIM capacitor can be constructed so as to occupy as little space as possible.

As described in detail above, according to the semiconductor device of the second embodiment, by providing a shield part inside the chip, noises radiated as radio waves from the open stub are shielded and are prevented from influencing the periphery of the circuits inside the chip. Furthermore, a capacitor a part of which includes a shield part can be formed and made to function as a decoupling capacitor, so that fluctuations in power source potential and ground potential caused by noises can be absorbed. Therefore, erroneous operations of the semiconductor device due to the noises can be prevented.

It is also possible that the semiconductor device 1$a$ of FIG. 4 has the shield part 21 and does not have the power source electrode 22. In this case, the shield effect of the shield part 21 is obtained. Additionally, the position of forming the shield part 21 is not limited as long as it is adjacent to the open stub OS1, and it may be in the wiring layer above the open stub OS1. In this case, radio waves can be prevented from leaking from the semiconductor device 1$a$ to the outside and prevented from influencing external apparatuses.

Figure 5:
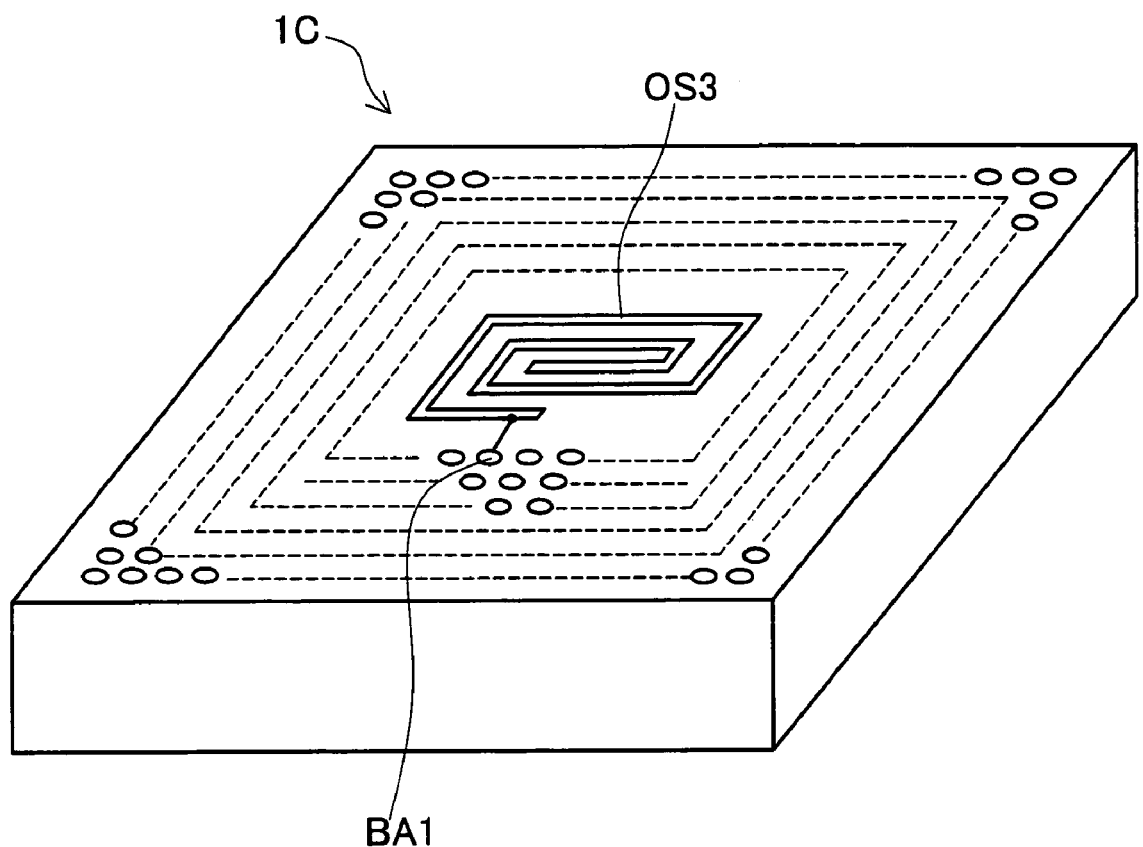
FIG. 5 is a schematic view of a BGA package of a semiconductor device 1c.

A third embodiment of the invention is described with reference to FIG. 5. The third embodiment is an embodiment in a case where the open stub is disposed in the power source wiring of the package of the semiconductor device and an external apparatus. FIG. 5 shows a schematic view when, for example, a package of BGA (Ball Grid Array) is used as the package of the semiconductor device 1$c$ of this embodiment. As shown in FIG. 5, on the back surface of the package, ball terminals as connection terminals are arranged in an array form. Among these, the ball terminal BA1 which is supplied with a power source is connected to the open stub OS3. The open stub OS3 is arranged on the back surface of the package so as to have a whorl-like form including a plurality of bends. The stub length of the open stub OS3 is set so as to have a length of a ¼ wavelength at the center frequency of noises generated by the semiconductor device 1$c$.

Action is described herein. Power source noises generated due to operation of the semiconductor device 1$c$ are outputted to the outside via the ball terminal BA1. The power source noises influence other apparatuses that use the same power source, so that an apparatus itself including the semiconductor device 1$c$ may erroneously operate. However, since the open stub OS3 is connected to the ball terminal BA1, the open stub OS3 serves as a BEF as described above and can reflect the basic wave component and odd-number harmonic components of noises so that they return to the semiconductor device 1$c$, whereby the noises are prevented from leaking from the semiconductor device 1$c$ to the outside.

Furthermore, since the open stub OS3 has a plurality of bends, the form of the location where the open stub OS3 is disposed can be freely set, and therefore, the open stub can be disposed within a predetermined space while maintaining the predetermined length corresponding to the ¼ wavelength. For example, in many BGA, as shown in FIG. 5, generally, the ball terminal is not provided at the center of the chip back surface and an empty space is created there, and the power source terminal is provided on the inner side (empty space side) of the array. Therefore, by forming the open stub OS3 into a whorl-like form, it becomes possible that the open stub OS3 is disposed while maintaining the predetermined length corresponding to the ¼ wavelength so that the empty space is effectively used.

As described in detail above, according to the semiconductor device of the third embodiment, by disposing the open stub between the power source wiring of the input and output terminals of the semiconductor device and the external device, the basic wave component and odd-number harmonic components of noises can be prevented from leaking from the semiconductor device to the outside. Therefore, an apparatus itself that includes the semiconductor device can be prevented from erroneously operating. Furthermore, by forming the open stub so as to have a plurality of bends, it becomes possible that the maximum side length of a region required for installing the open stub can be reduced while maintaining the length corresponding to the ¼ wavelength at the predetermined center frequency of power source noises. Therefore, the degree of freedom in the form of the open stub installation location is increased, so that the situation in that the installation location cannot be obtained and the open stub cannot be installed can be prevented.

Figure 6:
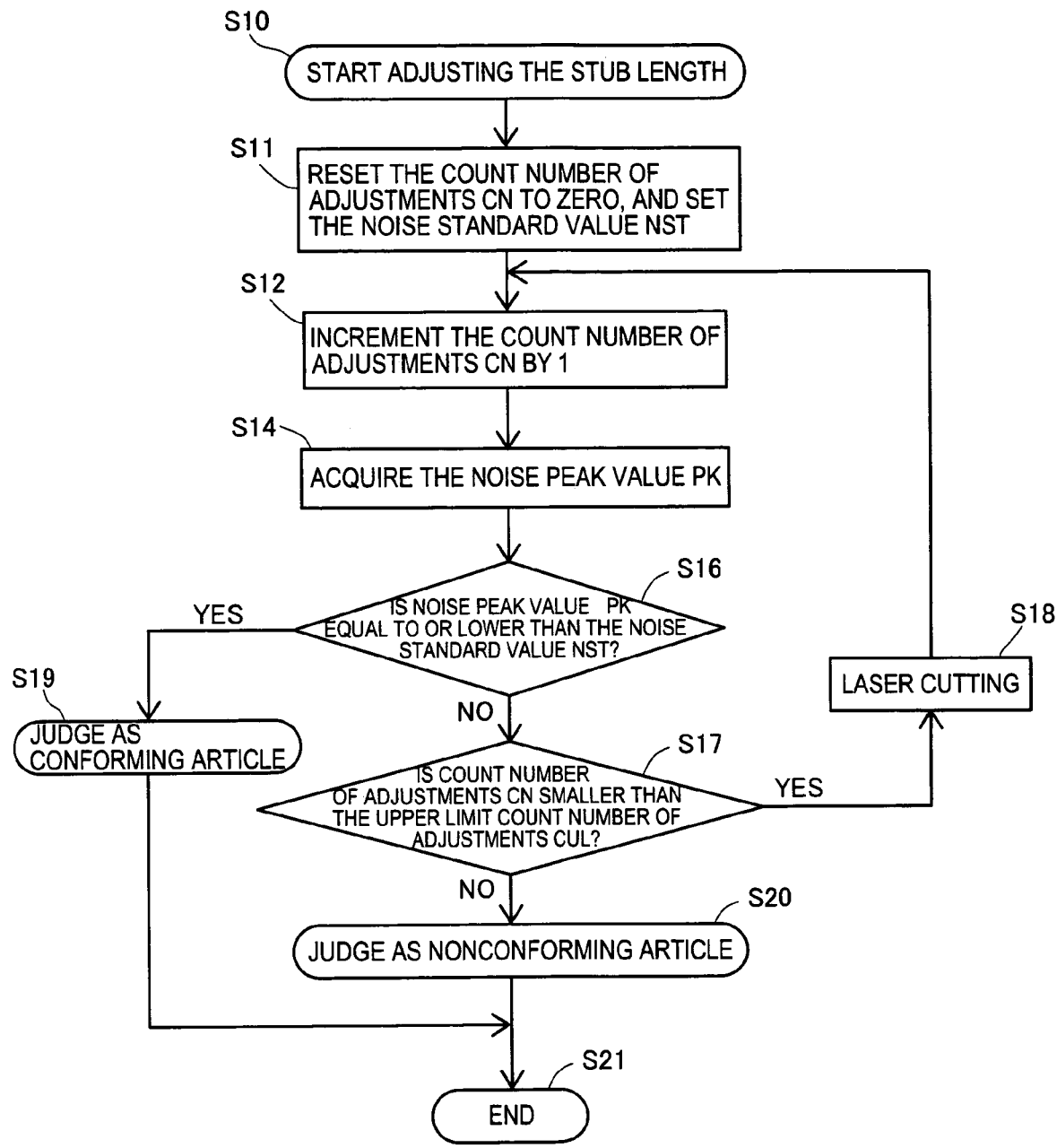
FIG. 6 is a flowchart showing procedures of open stub length adjustment.

A fourth embodiment of the invention is described with reference to FIG. 6 and FIG. 7. The fourth embodiment is an embodiment in which the center frequency of power source noises to be cut off by the open stub can be adjusted for each chip. In the semiconductor device, an open stub is provided. When the semiconductor device is packaged, the open stub is provided on the package surface as shown in FIG. 4. When the semiconductor device is not packaged, the open stub is provided on the chip surface. The functional test of the semiconductor device after being completed is conducted with a tester, etc., that is not shown. According to the results of the functional test, by a method similar to redundancy saving or the like, the open stub is laser-cut. Every time the laser cutting is carried out, the stub length of the open stub is shortened by a predetermined length for each.

The value of the center frequency component of the power source noises generated in the semiconductor device is a value according to the operation frequency and circuit design of the semiconductor device, so that it can be estimated. The initial length of the stub length of the open stub is set so as to have BEF performance with respect to a frequency a predetermined amount lower than the estimated value of the center frequency component of the power source noises. For example, when the estimated value of the noise center frequency component is 3.0 (GHz), the initial length of the stub length is set so as to obtain BEF performance with respect to a frequency of 2.8 (GHz). The predetermined length of the stub to be cut by one laser cutting is determined based on the upper limit count number of adjustments CUL and the noise standard value NST described later.

The procedures for adjusting the open stub length are described with reference to the flowchart of FIG. 6. In Step 10 (hereinafter, referred to as S10), when the stub length adjusting operation is started, the count number of adjustments CN is reset to zero and the noise standard value NST is set in S11.

The noise standard value NST is a standard value determining a permissible power source noise value, and is determined according to the design standards and required specifications of the semiconductor device. The lower the set noise standard value NST, the higher the reliability against erroneous operations. In S12, the count number of adjustments CN is incremented by 1.

In S14, a noise peak value PK of the power source noises actually generated in the semiconductor device is acquired. The noise peak value PK is a maximum value in all frequency components of the power source noises, and is obtained by using, for example, a peak hold circuit. For example, a case where, in a frequency component of 3.0 (GHz), a maximum value (noise peak value PK1) in measurement of power source noises is obtained is shown in FIG. 7.

In S16, it is judged whether or not the noise peak value PK1 is equal to or lower than the noise standard value NST. When the noise peak value PK1 is equal to or lower than the noise standard value NST, the process advances to S19 and it is judged that the semiconductor device as an inspection target satisfies the standards and product specifications and is a conforming article. Then, the process advances to S21 and the adjusting step is ended. On the other hand, when the noise peak value PK1 is equal to or higher than the standard value NST, the process advances to S17 and it is judged whether or not the count number of adjustments CN is smaller than the upper limit count number of adjustments CUL. The upper limit count number of adjustments CUL is determined in advance by considering the throughput of the tester, TAT, etc., of the functional test, and the yield of the semiconductor device.

In S17, when the count number of adjustments CN is equal to or more than the upper limit count number of adjustments CUL, this means that stub length could not be adjusted by a predetermined number of laser cutting, and the process advances to S20, and the semiconductor device 1 is judged as nonstandard and regarded as a nonconforming article. On the other hand, when the count number of adjustments CN is smaller than the upper limit count number of adjustments CUL, the process advances to S18, and laser cutting is carried out by an unillustrated cutting machine, whereby the open stub length is shortened by a predetermined length.

Figure 7:
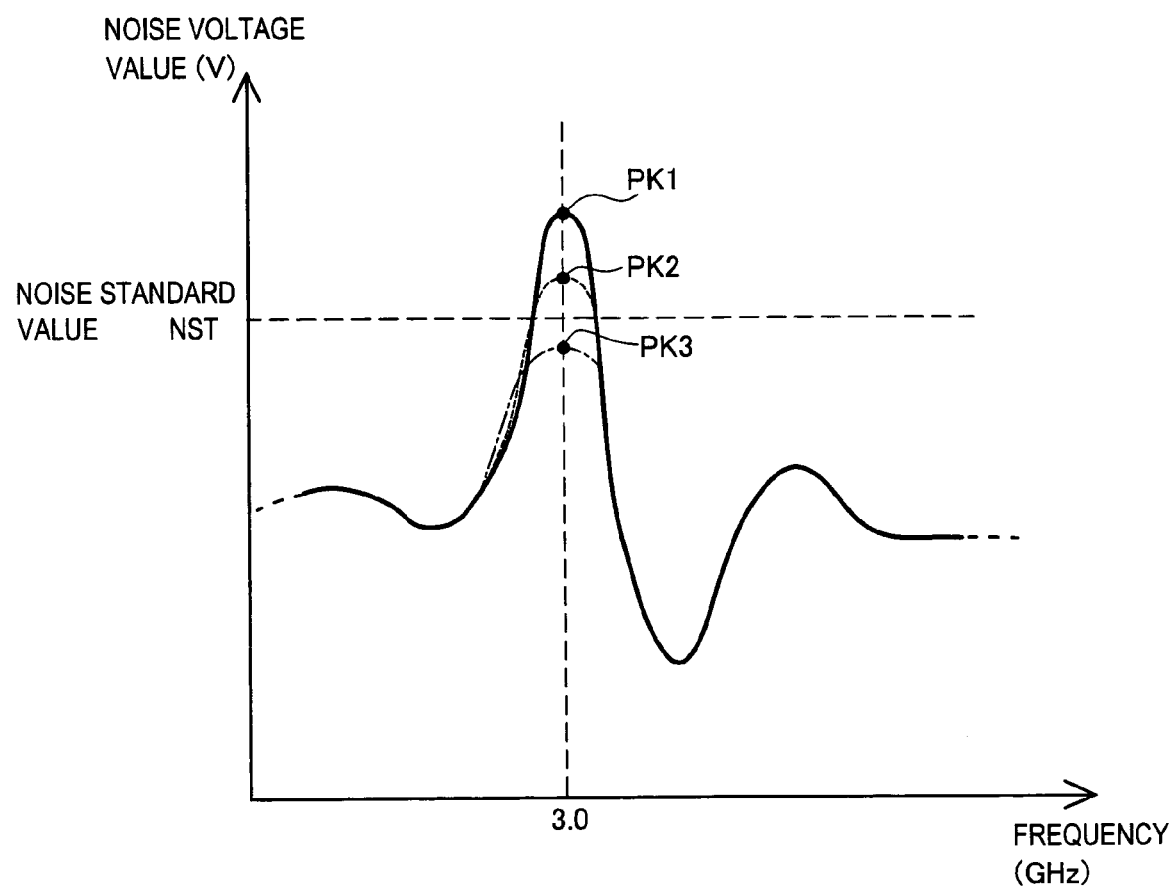
FIG. 7 is a graph showing noise peak values PK.

As shown in FIG. 7, the noise peak value PK1 is equal to or more than the noise standard value NST. Therefore, when the count number of adjustments CN (1 at present) is smaller than the upper limit count number of adjustments CUL, the process advances to S18 and laser cutting is carried out. When the stub length is shortened by a predetermined length by laser cutting, the frequency components of noises which can be reflected by the open stub are raised. Herein, when the length to be cut is set so that the frequency components are raised by 0.1 (GHz) by one laser cutting, the center frequency of the BEF performance of the open stub changes from 2.8 (GHz) to 2.9 (GHz). Simultaneously, the BEF performance with respect to odd-number harmonic waves also shifts.

Then, the process returns to S12 again, the count number of adjustments CN is incremented by 1 and made equal to 2, and then the noise peak value PK is acquired in S14 again. Herein, the center frequency of the BEF performance of the open stub is changed to 2.9 (GHz) close to the actual noise peak frequency (3.0 GHz). Therefore, the power source noise value at the frequency 3.0 (GHz) is reduced from the noise peak value PK1 to the noise peak value PK2. Then, in S16, it is judged whether or not the noise peak value PK2 is equal to or lower than the noise standard value NST.

Thereafter, the loop of S12 through S18 is repeated. Then, when laser cutting is carried out twice and the BEF performance of the open stub is changed to 3.0 (GHz), it matches the actual noise peak frequency. At this point, the greatest noise reduction effect is obtained, and as shown in FIG. 7, the noise peak value PK3 is obtained. Since the noise peak value PK3 is lower than the noise standard value NST, so that a conforming article is judged in S16, judgement as a conforming article is obtained in S19, and the process advances to S21 and the flow ends.

As described in detail above, according to the adjusting method for the semiconductor device relating to the fourth embodiment, the open stub is used for power source noise reduction of the semiconductor device and the open stub is disposed on the package surface of the chip surface, and then the stub length is adjusted, whereby it becomes possible to adjust the center frequency of noise that is desired to be cut, later. Therefore, it becomes possible to adjust the center frequency of the BEF performance of the open stub for each semiconductor device according to the actual noise maximum value, so that the power source noise influence can be more effectively reduced regardless of the center frequency scattering of noises generated in the semiconductor device. Therefore, it becomes possible to increase the yield of the semiconductor device and the noise resistance of the semiconductor device.

Adjustment of the center frequency of the BEF performance by shortening the stub length of the open stub is an irreversible adjusting method in one direction to raise the center frequency. Therefore, by setting the stub initial length so that the BEF performance is provided for a frequency that is a predetermined amount lower than the center frequency component estimated value of power source noise, it becomes possible to find a minimum point of the noise without fail by adjustment in the direction to raise the center frequency.

Figure 8:
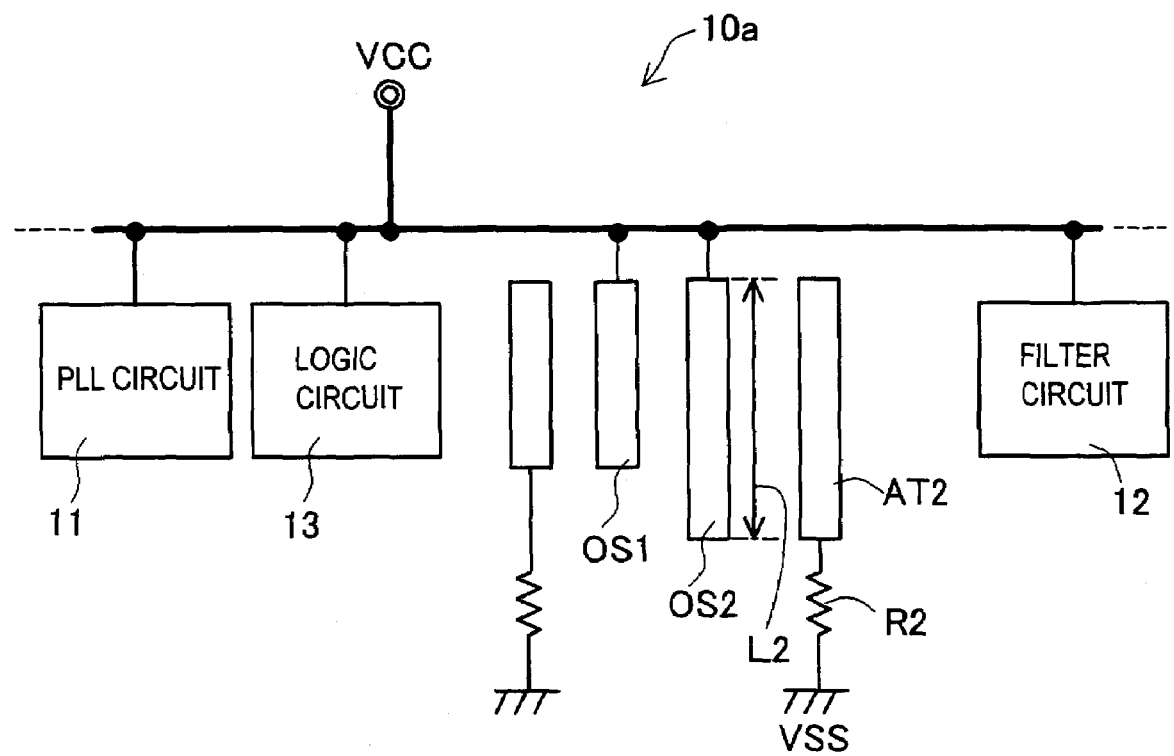
FIG. 8 is a diagram showing an equivalent circuit 10a of the semiconductor device 1.
Figure 9:
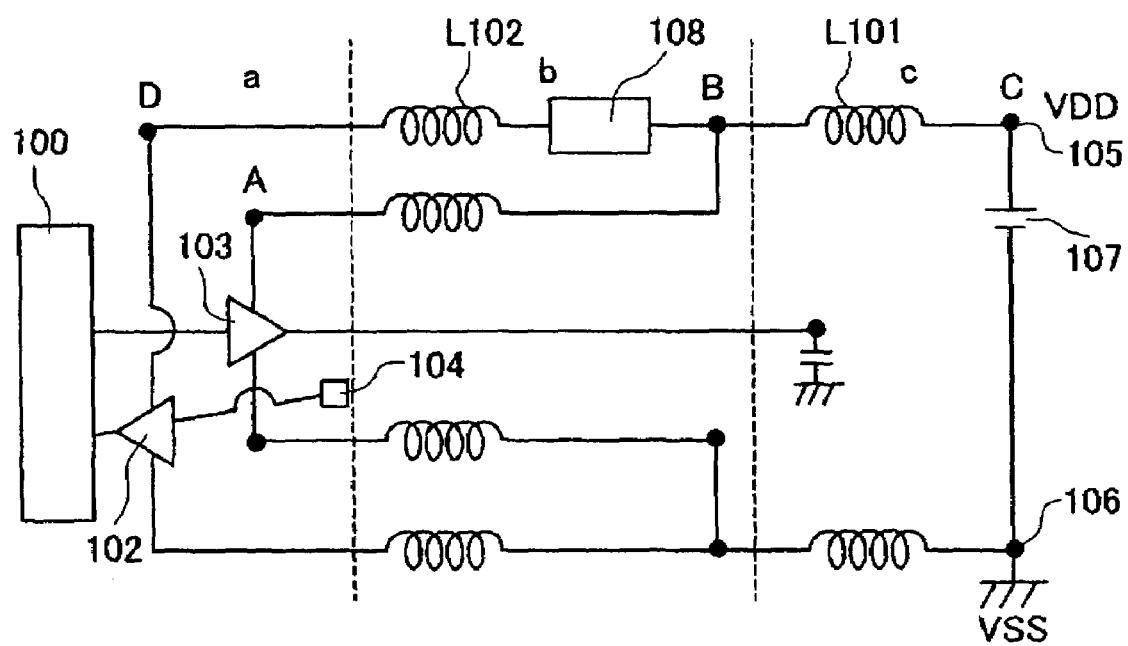
FIG. 9 is a circuit diagram provided with the open stub in the related art.

It is a matter of course that the present invention is not limited to the embodiments described above, and can be variously improved and modified without deviating from the spirit of the invention. In the first embodiment, as shown in the equivalent circuit 10 of FIG. 2, one open stub OS1 is provided in the power source wiring 4 in the connection line between the PLL circuit 11 and the filter circuit 12, however, the invention is not limited to this form, and it may be provided with a plurality of open stubs. For example, as shown in the equivalent circuit 10a of FIG. 8, the power source wiring 4 may be provided with an open stub OS2 having a stub length L2 and a resistor R2 different from those of the open stub OS1 and a noise receiving part AT2 adapted to the open stub OS2. The stub length L2 is set to the length of a ¼ wavelength at the center frequency of noise with a frequency different from the frequencies that are desired to be cut in the open stub OS1. In this case, a plurality of noises generated at predetermined frequencies from the PLL circuit 11 can be cut. Furthermore, as shown in FIG. 8 and FIG. 4, even when noises are generated from the respective PLL circuit 11 and the logic circuit 13 as block circuits plurally connected to the power source wiring 4, for example, the open sub OS1 is set as a noise filter for the PLL circuit 11 and the open stub OS2 is set as a noise filter for the logic circuit 13, whereby a plurality of noises generated at predetermined frequencies can be cut.

In addition, in the third embodiment (FIG. 5), a case where the open stub OS3 is disposed on the BGA package is illustrated, however, the invention is not limited to this form. When the open stub OS3 is disposed on the package, the package type and the location on the package are not limited, and of course, the open stub can be freely disposed. Even in various packages such as a PGA (pin grid array), a QFP (quad flat package), and a DIP, etc., the open stub OS3 can be disposed and the same effect can be obtained. The location on the package where the open stub OS3 is disposed is not limited. In a BGA, PGA, or the like, the open stub can be disposed not only on the back surface of the package where terminals exist but also on the front surface. The case where the open stub is mounted on the front surface further increases the degree of freedom of arrangement of the open stub since the front surface that includes no terminals has a wider area in that the open stub can be mounted. Furthermore, when a package such as a QFP, etc., includes terminals provided on the package side surface, of course, the open stub OS3 can be mounted on any of the front surface and the back surface of the package.

As a matter of course, the open stub OS3 can be provided not only on the package surface and the chip surface but also on a substrate to which the package is mounted. In this case, the open stub OS3 can be formed by using the method for forming substrate wiring, so that the open stub OS3 can be formed at low cost without requiring other new steps for forming the open stub OS3. In addition, in the case of forming on a substrate, the degree of freedom in open stub arrangement can be increased further since the substrate has an area wider than that of the package.

When an open stub is formed on the package surface or a substrate, the shield described in the second embodiment may be provided. At this point, more preferably, a first shield is provided between the open stub and the semiconductor device and a second shield is provided on the side opposite the first shield across the semiconductor device. Thereby, radio waves radiated from the open stub can be prevented by the first shield from influencing the semiconductor device. In addition, the radio waves are prevented by the second shield from influencing other apparatuses. Therefore, it becomes possible to prevent erroneous operations of the semiconductor device or apparatuses that include the semiconductor device. It is possible that the first shield and the second shield are formed by using the method for forming a multilayer wiring substrate. For example, the first and second shields are formed in the upper wiring layer and the lower wiring layer and an open stub is formed in the middle wiring layer so as to be sandwiched by the shields, whereby these can be formed at low cost without requiring other new steps of forming the open stub and the shields.

In the fourth embodiment, the flow of adjustment of the length of one open stub is described, however, the number of open stubs to be adjusted is not limited to one. As a matter of course, it is possible that a plurality of open stubs are provided and the stub lengths thereof are adjusted. In this case, it becomes possible to individually reduce noise values of a plurality of noises having center frequencies different from each other. The open stub length adjustment is described as an adjusting method in which the open stub length is shortened by laser cutting, however, the adjustment is not limited to this method. For example, it is also possible that wirings that are not connected are formed at intervals on the front end of the open stub, and the wirings are connected by a method such as wire bonding or the like according to the results of the functional test. Thereby, in the open stub adjusting method, adjustment becomes possible in both directions to lengthen and shorten the stub, and the degree of freedom is increased.

In the invention, a form in which an open stub is used for noise reduction in a power source wiring is described, however, as a matter of course, it may be used for other wirings such as a signal wiring.

The noise receiving parts AT1 and AT2 and the shield part 21 are an example of the first conducting part. The power source electrode part 22 is an example of the second conducting part.

According to the invention, not only erroneous operations due to noise propagation between semiconductor devices but also erroneous operations due to noise propagation between block circuits in a semiconductor device can be prevented. Therefore, noise cutting can be carried out pinpoint in smaller units, that is, at a level of noise cutting between blocks, so that noise propagation can be more effectively prevented and the semiconductor device can be prevented from erroneously operating. The open stub shows BEF performance for not only the predetermined frequency (basic wave component) but also odd-number harmonic components, so that it has an effect of reducing noises of CLK close to square waves including odd-number harmonic components. In addition, noises radiated as radio waves are received by the first conducting part and the received noise is sent to the potential which is biased in a predetermined level whereby noise components themselves existing in the power source wiring can be reduced, and this contributes to stable operations of the semiconductor device.

What is claimed is:

1. A semiconductor device comprising:
    at least one of open stubs connected to a power source wiring to which noise containing a predetermined frequency component is transmitted, and has a length corresponding to a ¼ wavelength of the predetermined frequency,
    a first conducting part biased to a predetermined potential and provided adjacent to the open stub, and
    a second conducting part insulated from the first conducting part and provided adjacent to the first conducting part,
    wherein a capacitor is formed by the first conducting part and the second conducting part.

2. The semiconductor device according to claim 1, wherein the noise contains two or more different predetermined frequency components, and the open stubs have a length corresponding to a ¼ wavelength of each predetermined frequency of the noise.

3. The semiconductor device according to claim 1, wherein the conducting part has an impedance component.

4. The semiconductor device according to claim 1, wherein the open stub has at least one bend.

* * * * *